US010978334B2

(12) United States Patent
Toh et al.

(10) Patent No.: US 10,978,334 B2
(45) Date of Patent: Apr. 13, 2021

(54) SEALING STRUCTURE FOR WORKPIECE TO SUBSTRATE BONDING IN A PROCESSING CHAMBER

(71) Applicant: Applied Materials, Inc., Santa Clara, CA (US)

(72) Inventors: Chin Hock Toh, Singapore (SG); Tuck Foong Koh, Singapore (SG); Sriskantharajah Thirunavukarasu, Singapore (SG); Jen Sern Lew, Singapore (SG); Arvind Sundarrajan, San Jose, CA (US); Seshadri Ramaswami, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 648 days.

(21) Appl. No.: 14/602,885

(22) Filed: Jan. 22, 2015

(65) Prior Publication Data
US 2016/0064267 A1    Mar. 3, 2016

Related U.S. Application Data

(60) Provisional application No. 62/044,468, filed on Sep. 2, 2014.

(51) Int. Cl.
| *H01L 21/687* | (2006.01) |
| *C23C 16/458* | (2006.01) |
| *H01J 37/32* | (2006.01) |
| *H01L 21/67* | (2006.01) |

(52) U.S. Cl.
CPC .... *H01L 21/68757* (2013.01); *C23C 16/4581* (2013.01); *H01J 37/32513* (2013.01); *H01J 37/32715* (2013.01); *H01L 21/67126* (2013.01); *H01L 21/68785* (2013.01); *H01L 2221/6834* (2013.01)

(58) Field of Classification Search
CPC .......... H01J 37/32715; H01J 37/32513; H01L 21/68785; H01L 21/6831; H01L 21/6833; H01L 21/67126; H01L 21/6835; H01L 2221/683; H01L 2221/6834
See application file for complete search history.

(56) References Cited

U.S. PATENT DOCUMENTS 5,840,427 A *  11/1998  Babu ................... C23C 16/0272
                                                              428/408
5,870,271 A *   2/1999  Herchen ................ H02N 13/00
                                                              361/234

(Continued)

OTHER PUBLICATIONS

Wypych, George. (2010). Handbook of Fillers (3rd Edition)—19. Fillers in Different Products. (pp. 711). ChemTec Publishing.*

(Continued)

*Primary Examiner* — Rakesh K Dhingra
*Assistant Examiner* — Laureen Chan
(74) *Attorney, Agent, or Firm* — Schwabe, Williamson & Wyatt, P.C.

(57) ABSTRACT

A sealing structure is between a workpiece or substrate and a carrier for plasma processing. In one example, a substrate carrier has a top surface for holding a substrate, the top surface having a perimeter and a resilient sealing ridge on the perimeter of the top surface to contact the substrate when the substrate is being carried on the carrier.

18 Claims, 5 Drawing Sheets

(56) References Cited

U.S. PATENT DOCUMENTS

| | | | |
|---|---|---|---|
| 6,284,093 B1* | 9/2001 | Ke | H01J 37/32623 156/345.51 |
| 7,195,673 B2* | 3/2007 | Shimizu | C23C 16/4583 118/723 E |
| 2003/0037882 A1* | 2/2003 | Arita | H01J 37/32082 156/345.51 |
| 2007/0284758 A1* | 12/2007 | Zhang | H01L 21/563 257/780 |
| 2008/0169588 A1* | 7/2008 | Shih | H01J 9/24 264/423 |
| 2009/0218560 A1* | 9/2009 | Flaim | H01L 21/6835 257/9 |
| 2010/0323124 A1* | 12/2010 | Vartabedian | C23C 4/18 427/569 |
| 2011/0308739 A1* | 12/2011 | McCutcheon | H01L 21/187 156/766 |
| 2012/0267049 A1* | 10/2012 | Stevens | C23C 16/5096 156/345.34 |
| 2012/0287552 A1* | 11/2012 | Shiraiwa | H01L 21/67103 361/234 |
| 2013/0120897 A1* | 5/2013 | Lin | H02N 13/00 361/234 |
| 2013/0155569 A1* | 6/2013 | Suuronen | H01L 21/6833 361/234 |
| 2014/0355169 A1* | 12/2014 | Maeta | H01L 21/6831 361/234 |
| 2014/0374144 A1* | 12/2014 | Burggraf | H01L 21/6835 174/250 |
| 2015/0332944 A1* | 11/2015 | Landesberger | H01L 21/67069 156/60 |

OTHER PUBLICATIONS

Ash, Michael Ash, Irene. (2003; 2013). Handbook of Solvents (2nd Edition)—Silicone. (pp. 485). Synapse Information Resources, Inc.*

* cited by examiner

SEALING STRUCTURE FOR WORKPIECE TO SUBSTRATE BONDING IN A PROCESSING CHAMBER

CROSS-REFERENCE TO RELATED APPLICATIONS

This application claims the priority of U.S. Provisional Patent Application Ser. No. 62/044,468, filed Sep. 2, 2014, entitled "SEALING STRUCTURE FOR WORKPIECE TO SUBSTRATE BONDING IN A PROCESSING CHAMBER" all of which are incorporated herein by reference in their entirety.

FIELD

The present description relates to the microelectronics manufacturing industry and more particularly to processing a workpiece in a plasma chamber.

BACKGROUND

The current market demand for smaller and more functional mobile devices and other computing platforms drives the semiconductor industry towards reducing the size of the chips that go into these computing platforms. The packages that contain the chips are also being reduced in size.

For some types of packages, thin silicon chips are required. This requires thin silicon wafers. In order to effectively process thin silicon wafers (including wafers as thin as or thinner than 30 µm), wafer carriers have been proposed. The carrier provides a rigid support to the wafer during transport and handling, Wafer carriers have also been proposed to provide support while a wafer is being thinned by backgrinding, h some other alternative production techniques, wafer carriers may be exposed to deposition, which may include common processes such as physical vapor deposition (PVD), chemical vapor deposition (CVD), atomic layer deposition (ALD), electrochemical deposition (ECD), etc., that are heavily utilized for thin film fabrication.

Many current wafer carriers are electrostatic carriers and hold the wafer without adhesive. The carrier bonds a full thickness wafer to a rigid substrate by electrostatic induction, To maintain the electrostatic bond, the carrier and wafer are made flat, especially for chemical mechanical polishing (CMP) and backgrinding processes that expose wafers to shear forces.

SUMMARY

A sealing structure is between a workpiece or substrate and a carrier for plasma processing. In one example, a substrate carrier has a top surface for holding a substrate, the top surface having a perimeter and a resilient sealing ridge on the perimeter of the top surface to contact the substrate when the substrate is being carried on the carrier.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
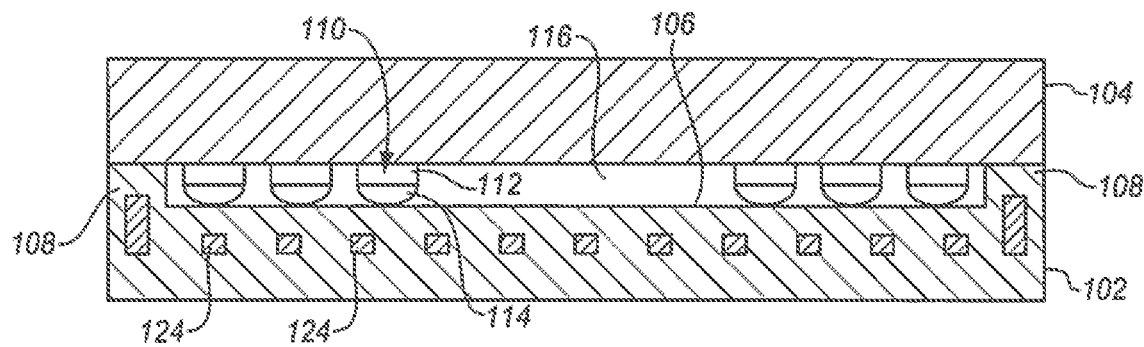
FIG. 1 is a side cross-sectional view of a carrier supporting a workpiece according to an embodiment.

Embodiments of the present invention provide sealing structures for wafer to substrate bonding. The sealing structure provides a benefit of protecting the wafer and the substrate from external chemicals in the chamber by a sealing structure and sealing material that is plasma resistant, chemical resistant, heat-resistant and topographically conforming. Additionally, the same material has another benefit of providing a stress buffer layer to resist damage from mechanical grinding. The material may have the advantage of serving as a topographically conforming medium to enhance thermal conductivity for better temperature control during processing.

Embodiments described herein include a structural body as a carrier that is attached to a support structure for use, for example with portable electrostatic chucking (ESC). The carrier has elevated features at or near the edges to seal the edge of the carrier against a wafer. A problem with placing a wafer, such as a silicon substrate, or other workpiece on a carrier is that materials may enter into the space between the workpiece and the carrier. This is a particular problem within a processing chamber, but materials may also enter into the space in other environments. The seal gives the benefit of preventing liquids, gases, and chemicals, from penetrating into the space between the carrier and the wafer. These materials cause the problem that they may attack or damage a workpiece being carried by the ESC, such as a silicon wafer. The workpiece may be a silicon wafer or another object of any shape and size and material to which a process is to be applied. It may be made from metals, ceramics, polymers or composites, such as a laminated tape or spin on material, plasma and vapor deposited materials, dry film materials, sprayed on materials or pre-fabricated structures.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other, "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

In some packaging systems such as 3D integration and FOWLP, topographical structures are built on the surface of the wafer. One such structure is an array of copper pillars. These may be up to 100 microns in height and 1% in density across the area of the wafer. These wafers are exceptionally prone to the formation of high stress regions and to reactions between the copper pillars with process chemicals and gases, among other problems.

FIG. 1 is a cross-sectional side view diagram of a carrier 102 supporting a workpiece 104. In this case the carrier 102 is an electrostatic carrier and has a series of electrodes 124 to apply electrostatic force to the workpiece 104. The electrostatic force grips the workpiece 104 and holds it in place on the carrier. The carrier may be made of any of a variety of dielectric materials and may be formed of multiple layers. Typically the carrier has a top dielectric ceramic top layer called a puck which has a top surface 106. The carrier also has structural layers and may also have thermal control layers for cooling, heating, and other functions. As shown, a ridge 108 is formed on the perimeter of the top surface of the carrier. The ridge in this example is indicated as being 50 micrometers in height however the particular height may be adapted to suit different applications. The workpiece 104 is placed on the ridge 108 to support the workpiece above the carrier.

The workpiece has multiple pillars 110, In this example the pillars have a copper post 112 extending from the bottom surface of the workpiece and a solder tip 114 at the extreme end of each post 112. These pillars are used later to electrically connect the workpiece to other equipment. For example, if the workpiece is a silicon substrate it will later be diced and each die will then use its respective pillars to attach the die to a socket or to a circuit board. The height of the ridge 108 is designed to be at least as high as the average pillar 110. In this way the workpiece is carried around its edge in a position that reduces stress against the pillars. As shown, the ridges extend up to and contact the workpiece 104 to support the workpiece near the perimeter and outer edge of the workpiece and the carrier. This seals the edge of the workpiece against any contaminants that might penetrate into the space 116 between the workpiece and the carrier.

Figure 2:
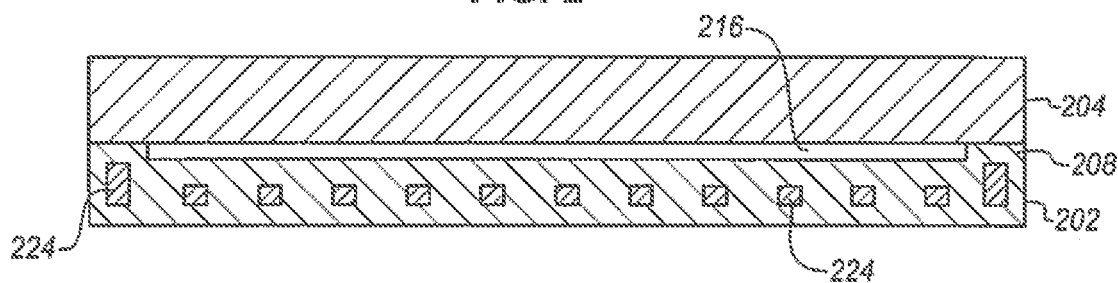
FIG. 2 is a side cross-sectional view of a carrier supporting a workpiece according to another embodiment.

FIG. 2 is a cross-sectional side view diagram showing an alternative design in which a carrier 202, such as an electrostatic chuck, carries a workpiece 204 that does not have any pillars. The carrier may be an electrostatic carrier with a series of electrodes 224 to create and maintain an electric charge. The carrier has a ridge 20 that extends ail the way around the periphery of the carrier upon which the workpiece 204 rests. The space 216 between the carrier and the workpiece that is enclosed by the ridge 208 is much smaller than in the example of FIG. 1, in this case, the ridge has a height of 10 µm, however, this height may be adapted to suit any particular type of workpiece or carrier combination. The ridge may be formed of any of a variety of deposited or applied materials. A resilient material may be used to form a seal against imperfect surfaces. F n elastomeric material, such as a polyolefin or polyimide may be used because these materials withstand many plasma process agents.

In the example of FIG. 2, the ridge is lower than in FIG. 1, for example 20 µm. The workpiece does not include the pillars 110 of FIG. 1 and so the distance between the bottom surface of the workpiece and the top of the carrier may be less and may be less than 20 µm, depending on the particular implementation. These two examples illustrate that a carrier or a sealing ridge on the carrier may be adjusted for different applications and to accommodate different types of workpieces.

Figure 3:
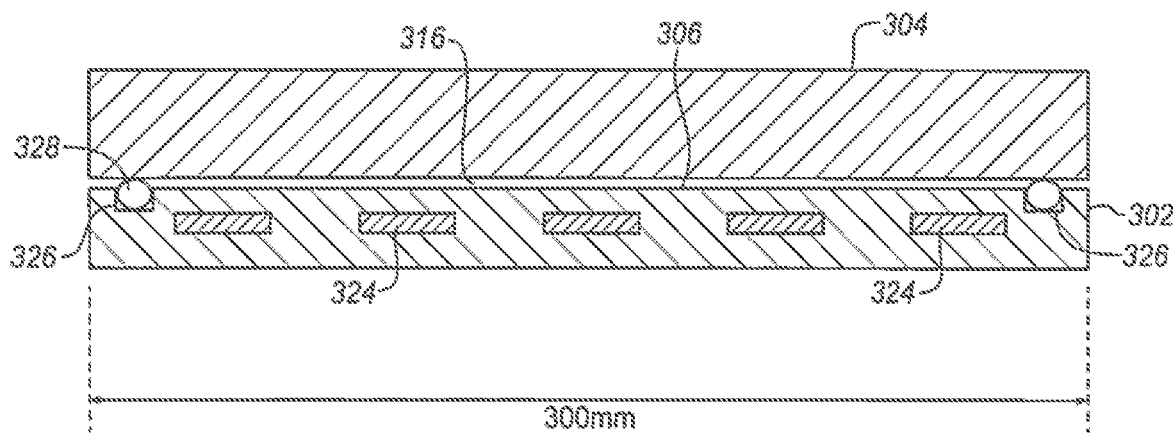
FIG. 3 is a side cross-sectional view of a carrier supporting a workpiece according to a third embodiment.

While in the examples of FIGS. 1 and 2 the ridge 108 or 208, respectively, is formed on a top surface of the top plate of the carrier, in FIG. 3 a different type of sealing ridge is used. In FIG. 3 the carrier 302 has a groove 326 which extends around the periphery of the carrier, FIG. 3 is a cross-sectional side view of an alternative carrier. The groove 326 extends all the way around the perimeter of the top surface 306 of the carrier 302. As in the previous example, the carrier is an electrostatic carrier with electrodes 324 arranged across and within the top surface to create an electrostatic charge to grip a workpiece 304. The groove 326 carries an O ring 328 which may be made of any of a variety of different synthetic robbers or other resilient elastomeric materials.

The O ring groove is configured to be deep enough to allow the O ring to seal against the groove and at the same time reduce the gap 316 between the carrier and the workpiece. Just as the ridges 208 described above prevents any material including gas and ion contaminants from seeping into the space between the carrier and the substrate, the O ring also forms a seal against the bottom surface of the workpiece and the top surface of the carrier. The O-ring may be made of a variety of conventional materials or may be made of an elastomeric material, such as a polyolefin or polyimide. The size of the groove may be adapted to suit the size of the O-ring. In this example, the grove may be a few millimeters across to accommodate a distance of a few millimeters between the workpiece and the carrier.

Figure 4:
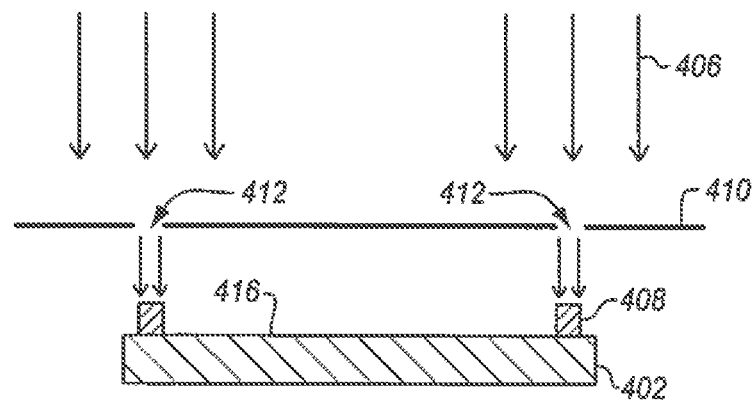
FIG. 4 is a side cross-sectional view of forming a ridge on a carrier by deposition according to an embodiment.

FIG. 4 is a cross-sectional side view diagram of a ridge being formed on a top surface of a carrier. The carrier 402 has a smooth, flat planar surface formed, as mentioned above, from a dielectric material, typically a ceramic or a metal oxide. A second material 406 is applied onto the carrier 402 through a mask 410 by spin coating. The mask has a slit 412 around the perimeter of the top surface of the carrier to allow the spin coat material to be applied in a ring shape around the edge of the carrier 402. The spin coating can precisely control the amount of material that is deposited on the carrier 402 to create the circumferential ridge 408 as shown. The ridge is deposited or applied over the top surface 416 of the carrier. The ridge may be made very low for a flat workpiece surface or it may be made taller to accommodate copper pillars or other types of features on the workpiece.

Figure 5A:
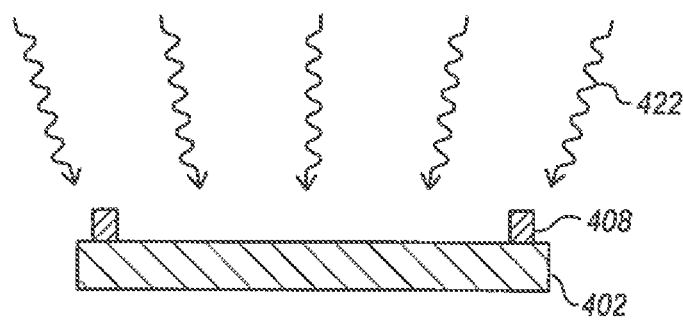
FIG. 5A is a side cross-sectional view of forming a ridge on a carrier by curing the ridge of FIG. 4 according to an embodiment.
Figure 5B:
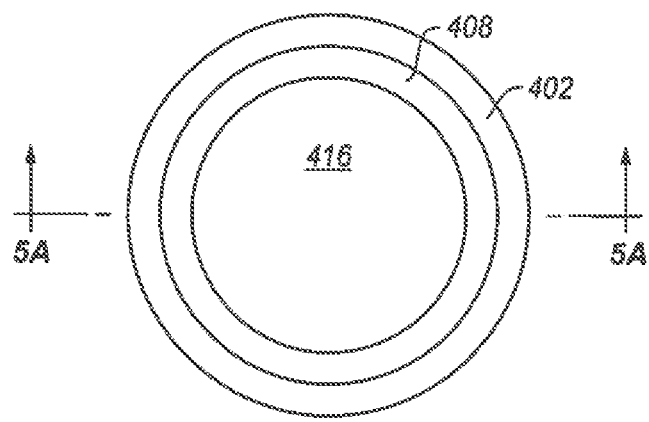
FIG. 5B is a top plan view corresponding to FIG. 5A according to an embodiment.

After the ridge has been formed on the carrier, the carrier is moved to an oven that applies heat 422 to the ridge so that it may cure. The application of heat to the ridge is shown in FIG. 5A. FIG. 5B is a top plan view diagram of the resulting structure showing the circular outer perimeter of the carrier 402. For a 300 mm wafer, the carrier will be about 300 mm in diameter or a little larger. The carriers shown and described herein may be in any shape or size to accommodate a particular workpiece. The ridge 408 follows along the perimeter of the top surface 416 of the carrier. In the example of FIGS. 4 and 5A, the ridge is offset from the edge of the carrier, while in the example of FIGS. 1 and 2 the ridge is at the edge of the carrier. The particular position of the ridge may be adapted to suit different types of carriers and different types of workpieces. These and the other drawing figures herein are not to scale. The scale has been changed between drawings to better illustrate the embodiments.

Figure 6:
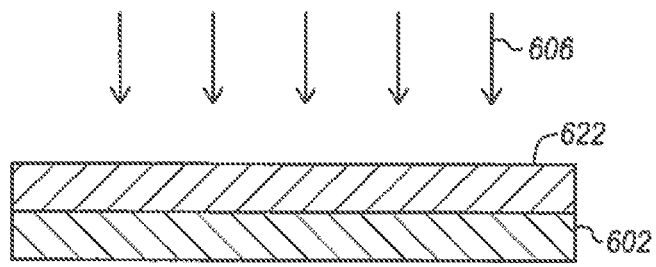
FIGS. 6-8 are side cross-sectional views of forming a ridge by deposition and removal according to an embodiment of the invention.

FIG. 6 shows a cross-sectional side view of a carrier 602 for which a different fabrication process is used. A suitable ridge material 606 is applied over the carrier 602 to form a layer 622 over the top of the carrier. In this example, the material layer 622 extends across the entire surface of the carrier 602.

Figure 7:
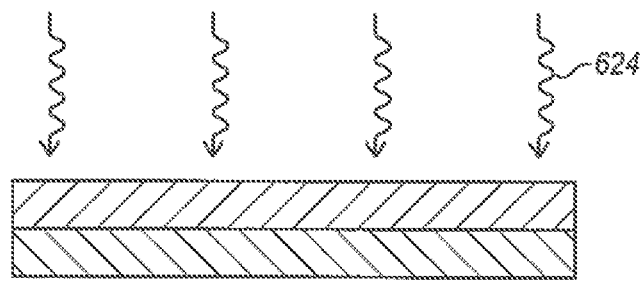
Figure 8:
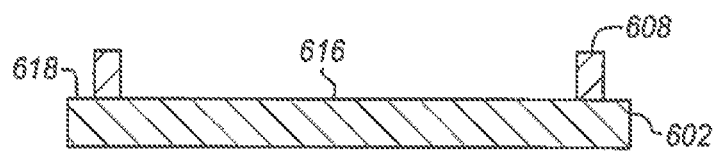

The deposited ridge material, as shown in FIG. 7, is then cured by applying heat 624 to the deposited material. As shown in FIG. 8 the excess material is removed so that only a ridge 608 around the perimeter of the top surface of the carrier remains. In this case the center of the material has been removed to expose the top surface 616 of the carrier. In addition, the outer edge of the material has been removed to expose an outer edge 618 of the carrier.

Figure 9:
FIGS. 9 and 10 are side cross-sectional views of forming a ridge by machining and inserting an O-ring according to an embodiment of the invention.
Figure 10:

FIG. 9 shows an alternative process in which the carrier 902 with a smooth flat top surface 916 has been machined to form grooves 926 around the perimeter of the carrier 902. The depth of these grooves is chosen to carry a particular size of elastomeric O ring. As shown in FIG. 10 an O ring 928 is placed into the groove which may then be used to seal the carrier against a workpiece. The thickness of the O ring may be selected to minimize the distance between the carrier and the substrate while still accommodating any surface features on the workpiece that may be facing toward the substrate.

Figure 11:
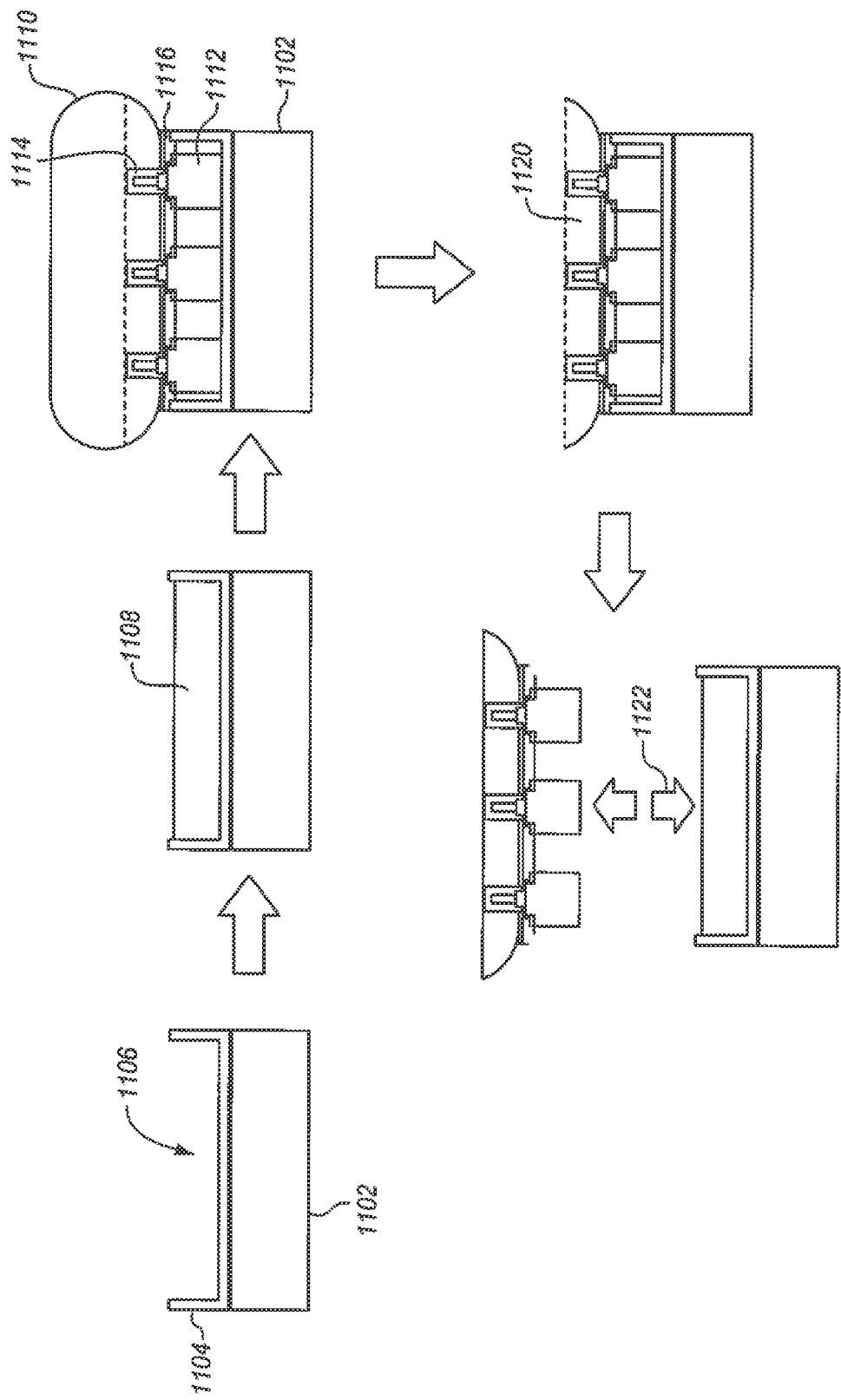
FIG. 11 is a sequence of side cross-sectional views of attaching a workpiece to a carrier according to an embodiment of the invention.

FIG. 11 is a sequence of cross-sectional side view diagrams to show a sequence of stages for attaching a silicon device wafer to a carrier as shown and described above. The carrier 1102 has an edge seal 1104 around the perimeter of its top surface. In this example, the edge seal also extends across the top surface of the carrier to fill the space that is enclosed by the peripheral edge seal. The edge seal may be formed in any of the ways described above, among others. The resilient edge seal forms a well 1106 in the center of the carrier that is enclosed by the edge seal or ridge.

The well is filled with a conductive underfill 1108. The underfill is optional and provides beneficial properties of reducing stress on the device wafer when it is in the carrier and improving conductivity between the wafer and the carrier. The underfill may be selected from a variety of different materials with high thermal conductivity and stability at the temperatures at which the processes will be performed. Examples of suitable underfill materials include gallium and conductive silicone. These materials may be filled with heat conductive particles such as metal, copper or aluminum, carbon, or silicon compounds, among others. After the underfill has been applied to the carrier, the device wafer 1110 is gripped by the carrier using for example an electrostatic force.

In the illustrated example the wafer optionally includes copper pillars 1112, copper pads 1114 on the device wafer to which the pillars are attached, a dielectric filler 1116 on the device wafer between each copper pad 1114 and any other desired structures suitable for the wafer and its particular application. Alternatively, the wafer has different structures or no such structures. After the device wafer is gripped, the wafer is thinned using backgrinding. The back side of the wafer is partially removed to reduce the thickness of the wafer and allow it to be packaged in a smaller package.

Following the completion of the grinding process, the thinned wafer 1120 can then be removed or detached 1122 from the carrier. The device wafer may be removed in a variety of ways depending upon the particular implementation. In one example the electrostatic charge on the electrodes is reversed to release the electrostatic grip on the device wafer. Lift pins in the carrier then push the wafer away from the carrier. A vacuum tool then lifts the workpiece away from the carrier and moves the wafer to a different location for the next fabrication process. Any of a variety of different de-chucking techniques may be used depending on the particular application.

The operations of FIG. 11 may be applied to any of the carrier variations described herein. The conductive underfill 1108 is not required and may be adapted to suit different applications. While the carrier and edge sealing ridge described herein is particularly suitable for backgrinding it may also be used for many other operations including plasma processes, deposition processes, annealing processes, machining and other kinds of processes.

The sealed carrier and substrate are also useful for other types of processes. These include lamination, including pressure lamination, etc. The carrier may also be used for spin-on processes using a rotating spindle attached to a pedestal, chuck, or other support type. The carrier may also be used in plasma and vapor deposition processes include plasma vapor deposition, chemical vapor deposition, atomic layer deposition, etc.

As described herein a sealing edge ring may be placed over the top surface of a carrier, such as a flat ESC. The ring can be formed on the top surface, machined into the top surface or a ring may be placed into a trench engraved in the ESC. The ring may be integral to the ESC or added in a later process.

The sealing ring may be formed in one or more process steps, depending on the desired characteristics for the ring and the workpiece that is to be carried. In one example, a layer is applied by spin-on deposition. The material is planarized. Then the material at the center is removed to create an elevated edge around the top surface of the carrier. Alternatively, plasma-enhanced chemical vapor deposition may be used to build up a layer of seal material over the carrier. The material at the center is then removed to create the elevated edges.

A pre-fabricated ESC architecture may be used in which the carrier top surface is manufactured with elevated edges by casting, machining, or any other way. One or more seal coatings are then sprayed over the edges or the entire carrier top surface. The coatings are then heat treated.

The edge seal may be permanently bonded or attached to a planar or flat ESC architecture. Alternatively, the edge seal may be temporary and even recyclable. The edge seal may be removable using any of a variety of different methods, such as cleaning with a wet or fluid solvent under a dry or plasma environment, etc. The edge seal may also be temporary and removable using a thermal treatment, cleaning or another process and then be re applied for another use.

Figure 12:
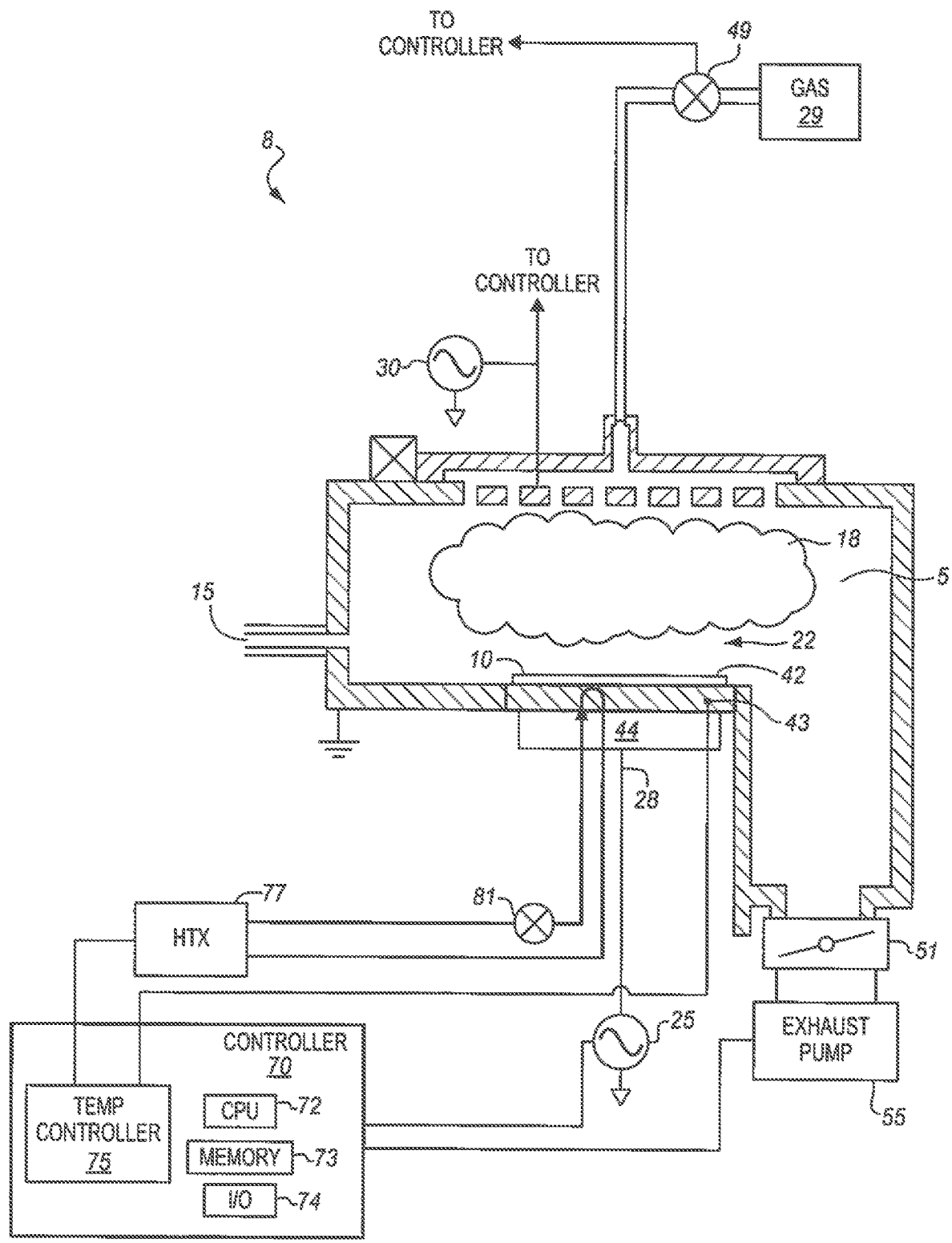
FIG. 12 is a diagram of a plasma processing apparatus for a workpiece according to an embodiment of the present invention.

FIG. 12 is a schematic of a wafer processing system 8 that may be used for plasma etch, ion doping, ion deposition, or for a variety of other purposes. The system includes a workpiece support assembly 42 which may be a platen, a carrier, a chuck, as pedestal, or any other workpiece support system. The processing system 8 may be any type of chamber known in the art, such as, but not limited to, Enabler®, DPS II®, AdvantEdge™ G3, EMAX®, Axiom®, or Mesa™ chambers all of which are manufactured by Applied Materials of California, USA. Other commercially available processing chambers may similarly utilize the techniques and apparatus described herein. While the exemplary embodiments are described in the context of a plasma etch system, the techniques and apparatus described herein is also adaptable to other processing systems used to perform other fabrication process (e.g., plasma deposition systems, three-dimensional printing systems, etc.)

The processing system 8 includes a grounded chamber 5. Process gases are supplied from gas source(s) 29 connected to the chamber through a mass flow controller gas source valve 49 to the interior of the chamber 5. The gas source may be used as the primary source of dopants or etchants to the chamber. Any of a variety of suitable ionizable gases may be used in the process chamber.

The chamber 5 is evacuated via an exhaust valve 51 connected to a high capacity vacuum pump stack 55. When plasma power is applied to the chamber 5, a plasma 18 is formed in a processing region 22 over a workpiece 10. A plasma bias power 25 is coupled into the wafer support assembly 42 to draw the energized ions from the plasma to the workpiece. The plasma bias power 25 may be in a range of from 2 MHz to 60 MHz. The plasma bias power 25 is coupled to a lower electrode (not shown) via a power conduit 28. A second plasma source power 30 or branch of the same source is coupled to a plasma generating element to provide high frequency source power to inductively or capacitively energize the plasma. The pressure within the chamber may be controlled using the gas source valve 49 and the exhaust pump 55 under the control of a controller 70.

The workpiece 10 is loaded through an opening 15 and placed on the wafer support assembly inside the chamber. The workpiece may be clamped, glued, or attached using an electrostatic force, vacuum or gravity. The workpiece 10, such as a semiconductor wafer bonded to a carrier, may be any type of wafer, substrate, or other material, including silicon, glass, or polymer for use in semiconductors, solar panel, optical waveguides, micro-machines and other devices. The workpiece 10 is disposed on a top surface of a carrier that is disposed over a base assembly 44 of the chuck or carrier assembly. The base assembly may provide temperature control, scanning, or other types of motion control.

A system controller 70 is coupled to a variety of different systems to control a fabrication process in the chamber. If the workpiece support is a thermally controlled chuck assembly, then the controller 70 may include a temperature controller 75 to execute temperature control algorithms (e.g., temperature feedback control) and may be either software or hardware or a combination of both software and hardware. The system controller 70 also includes a central processing unit 72, memory 73 and input/output interface 74.

The temperature controller receives a temperature reading from a sensor 43 on the chuck. The temperature sensor may be proximate a coolant channel, proximate the wafer, or placed in the dielectric material of the chuck. The temperature controller 75 uses the sensed temperature or temperatures to output control signals affecting the rate of heat transfer between the chuck assembly 44 and a heat source and/or heat sink external to the plasma chamber 5, such as a heater power supply 76 and a heat exchanger 77. The heater power supply provides current to drive one or more heaters (not shown) within the chuck assembly 44.

The system may also include a controlled heat transfer fluid loop with flow controlled based on the temperature feedback loop. In the example embodiment, the temperature controller 75 is coupled to a heat exchanger (HTX)/chiller 77. Heat transfer fluid flows through a valve 81 at a rate controlled by the valve through the heat transfer fluid loop. The heat transfer fluid flows through conduits in the chuck assembly 44 and then returns to the HTX 77. The temperature of the heat transfer fluid is decreased by the HTX and then the fluid is returned through the loop hack to the chuck assembly.

The valve 81 (or other flow control devices) between the HTX 77 and fluid conduits in the chuck assembly 44 may be controlled by the temperature controller 75 to control a rate of flow of the heat transfer fluid to the fluid loop. The electric heaters are used in the chuck assembly to apply heat to the chuck assembly.

The process chamber of FIG. 12, or another process chamber, may be used to create a variety of different ion energy distributions. In one example, the ion energy distribution is controlled in the chamber using a plasma that is generated with a Capacitively Coupled Plasma (CCP) source or an inductively Coupled Plasma (ICP) source. Power within a range from about 400 W to 2000 W power is applied to the plasma source to ignite and maintain the plasma.

It is to be understood that the above description is intended to be illustrative, and not restrictive. For example, while sequential diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A substrate carrier comprising:
a top surface for holding a substrate, the top surface having a perimeter;
a sealing ridge on the perimeter of the top surface extending above the top surface to contact a perimeter of the substrate when the substrate is being carried, wherein the sealing ridge further comprises a heat treated seal coating over a top and over inner and outer side surfaces of the sealing ridge, the heat treated seal coating not on portions of the top surface of the substrate carrier that are not covered by the sealing ridge, the heat treated seal coating is only on the sealing ridge, the heat treated seal coating to contact the substrate and prevent materials from passing past the sealing ridge to contact the substrate, the sealing ridge defining a single continuous well over an entirety of the portion of the top surface of the substrate carrier that is enclosed by the sealing ridge.

2. The substrate carrier of claim 1, wherein the ridge is resilient and formed of one of a polyolefin or a polyimide.

3. The substrate carrier of claim 1, wherein the sealing ridge is formed by spin-coating a material onto the perimeter of the top surface through a mask.

4. The substrate carrier of claim 1, wherein the sealing ridge is formed by deposition.

5. The substrate carrier of claim 1, where the sealing ridge is further formed by removing material on the top surface within the perimeter of the top surface.

6. The substrate carrier of claim 1, wherein the ridge is an O-ring in a groove of the carrier.

7. The substrate carrier of claim 1, further comprising a thermally conductive underfill on the top surface within the sealing ridge of the top surface, the underfill to contact the substrate when the substrate is being carried on the carrier.

8. The substrate carrier of claim 7, wherein the underfill is formed of a silicone filled with heat conductive particles.

9. The substrate carrier of claim 7, wherein the underfill has a thickness to contact the substrate.

10. The substrate carrier of claim 1, wherein the substrate has a plurality of pillars facing the top surface when the substrate is being carried on the carrier and wherein the sealing ridge has a height from the top surface of the carrier that is at least as high as the height by which an average pillar extends from the surface of the substrate.

11. The substrate carrier of claim 1, further comprising electrodes for applying an electrical charge to the carrier to grip a substrate so that the ridge contacts a perimeter of the substrate.

12. The substrate carrier of claim 10, wherein gripping the substrate comprises gripping the workpiece so that the pillars are between the substrate and the carrier.

13. The substrate carrier of claim 7, wherein the underfill is a conductive silicone.

14. A processing system comprising:
a plasma chamber to contain a workpiece, the chamber having a gas source and an exhaust pump;
a plasma source to generate a plasma within the chamber;
a voltage source to drive a radio frequency bias voltage on the plasma; and
a pedestal to carry a workpiece within the chamber, the pedestal having a workpiece carrier, the carrier having a top surface for holding a workpiece, the top surface having a perimeter, and a sealing ridge on the perimeter of the top surface extending above the top surface to contact a perimeter of the workpiece when the workpiece is being carried on the carrier, wherein the sealing ridge further comprises a heat treated seal coating over a top and over inner and outer side surfaces of the sealing ridge, the heat treated seal coating not on portions of the top surface of the carrier that are not covered by the sealing ridge, the heat treated seal coating is only on the sealing ridge, the sealing ridge defining a single continuous well over an entirety of the portion of the top surface of the substrate carrier that is enclosed by the sealing ridge.

15. The system of claim 14, wherein the sealing ridge is formed of a polyolefin or polyimide.

16. The system of claim 14, further comprising a thermally conductive underfill on the top surface within the sealing ridge of the top surface, the underfill to contact the workpiece when the workpiece is being carried on the carrier.

17. The substrate carrier of claim 7, wherein the thermally conductive underfill comprises gallium.

18. The substrate carrier of claim 11, wherein the sealing ridge is permanently bonded to the top surface of the substrate carrier.

* * * * *